United States Patent [19]

Bartol

[11] Patent Number: 5,210,855
[45] Date of Patent: May 11, 1993

[54] SYSTEM FOR COMPUTER PERIPHERAL BUS FOR ALLOWING HOT EXTRACTION ON INSERTION WITHOUT DISRUPTING ADJACENT DEVICES

[75] Inventor: Thomas M. Bartol, Hillsborough, N.C.

[73] Assignee: International Business Machines Corporation, Armonk, N.Y.

[21] Appl. No.: 957,746

[22] Filed: Oct. 7, 1992

Related U.S. Application Data

[63] Continuation of Ser. No. 364,742, Jun. 9, 1989, abandoned.

[51] Int. Cl.$^5$ ............................................. G06F 13/00
[52] U.S. Cl. ................................... 395/500; 364/514; 364/DIG. 2; 395/325; 395/800
[58] Field of Search ............... 395/500, 325, 800; 364/132, 514; 439/56, 59; 361/407, 413

[56] References Cited

U.S. PATENT DOCUMENTS

| | | | |
|---|---|---|---|
| 3,691,432 | 9/1972 | Edfors et al. | 317/100 |
| 4,118,093 | 10/1978 | Obeissart | 339/75 M |
| 4,152,037 | 5/1979 | Bonhomme | 339/75 MP |
| 4,479,692 | 10/1984 | Greenwood | 339/99 R |
| 4,510,553 | 4/1985 | Faultersack | 361/413 |
| 4,582,381 | 4/1986 | Bisczat | 339/82 |
| 4,678,257 | 7/1987 | Ahroni | 439/426 |
| 4,747,783 | 5/1988 | Bellamy et al. | 439/59 |
| 4,750,136 | 6/1988 | Arpin et al. | 364/514 |
| 4,778,398 | 10/1988 | Ahroni | 439/143 |
| 4,819,149 | 4/1989 | Sanik et al. | 364/132 |
| 4,870,704 | 9/1989 | Matelain et al. | 364/200 |
| 4,889,495 | 12/1989 | Kimura | 439/60 |
| 4,897,055 | 1/1990 | Jurista et al. | 439/424 |
| 4,999,787 | 3/1991 | McNally et al. | 364/514 |

OTHER PUBLICATIONS

Small Computer Interface (SCSI), ANSI, Dec. 1989, pp. 1.1, 22-25.
Small Computer Interface-2 (SCSI-2) ANSI, Mar. 1989, 6-0-0-4, 4-(19-22).

Primary Examiner—Thomas C. Lee
Assistant Examiner—L. Donaghue
Attorney, Agent, or Firm—Winfield J. Brown, Jr.; John C. Black

[57] ABSTRACT

A method and apparatus for rapid interconnection (hot plugging) peripheral device interface circuits to a computer bus is disclosed. The interconnections are completed using three sets of conductors in the sequence: common grounds, power from the bus and data lines. The time period between the interconnections is determined by the relative set back lengths of the conductors from the card edge and allows for stabilization of voltage and establishment of a stable high impedance state for the peripheral device controller circuits before the data lines are interconnected.

6 Claims, 5 Drawing Sheets

SYSTEM FOR COMPUTER PERIPHERAL BUS FOR ALLOWING HOT EXTRACTION ON INSERTION WITHOUT DISRUPTING ADJACENT DEVICES

This is a continuation of copending application Ser. No. 07/364,742, filed on Jun. 9, 1989, now abandoned.

BACKGROUND OF THE INVENTION

1. Field of the Invention

The present invention relates to computer buses and particularly to a method and apparatus for facilitating the rapid interconnection of peripheral device interface circuits to a computer bus to establish both power and two-way data transfer. The interconnection is done in a "hot plug" mode in that neither power nor the data transfer are interrupted during the interconnection of a new peripheral device.

2. Description of the Prior Art

Various methods and apparatus for the rapid interconnection of peripheral device interfaces or control circuits to computer buses are known in the art. In an effort to minimize the impact of plugging into a bus, the normal procedure has been to shut down the bus so that new devices would not disrupt data flow on the bus. In contrast the hot plugging concept provides both power and data transfer interconnections without causing interruption of ongoing data transfers on the bus. Hot plugging is found in fault tolerant systems which normally include device or field replaceable unit redundancy coupled through operational comparison and checking logic to ensure correct operation. When a fault is detected an indication of the failing device is provided to service personnel. The failing device is then simply removed from the bus and a replacement device connected. The removal of the failing device and the replacement of a new device are performed without regard to ongoing bus activity. Both the bus architecture and the control device electronics must be carefully designed to achieve this "hot plugging" capability.

The normal control circuits contain electronic microchips mounted on printed circuit (pc) boards. A voltage regulator is included on the p.c. board and circuit interconnections to the bus and for power and data transfer are made via edge connectors. Edge connectors are mounted on a printed circuit board which is plugged into a corresponding receptacle for connection to the bus. Plugging in the board makes electrical contact between the edge connectors and the corresponding bus receptacle and thus provides both power to the electronic components on the pc board and interconnects it with the bus in one operation. For hot plugging, the normal method of interconnection is to increase the length of at least the ground contact on the edge connector, so that a ground contact can be completed prior to the electrical connection of the other contacts for the application of power and the transfer of data signals. Because of the control of the design parameters of the bus architecture and control circuits, hot plugging such circuits into a computer bus ordinarily causes no disruption in the two-way transfer of information on the bus.

Of particular interest is the widening use of the standardized (Small Computer System Interface (SCSI)) bus. The standard defines the mechanical, electrical, and functional requirements for a small computer input/output bus and command protocols to enable attaching small computers with each other and with intelligent peripheral devices such as rigid or flexible disks, magnetic tape drives, printers, optical disks and other direct access storage devices (DASD). Such devices will hereafter be referred to as either SCSI compatible devices or more generally as peripheral devices. The primary objective is to provide host computers with device independence within a class of devices of SCSI to enable a variety of different devices to be added to host computers without requiring modifications to generic system hardware or software.

Several draft specification proposals were presented by the American National Standards for Information Systems, including those dated Dec. 16, 1985 and Mar. 16, 1989. In Section 4.4 of the SCSI specification, there is presented the electrical description for the SCSI bus. The specification allows for the use of TTL technology for the device controllers so that either open collector or tri-state driver devices may be used for interconnecting to the SCSI bus. There are considerable differences in the two types of driver devices since tri-state devices are considerably faster at coming up to operational logic voltage levels than are open collector devices. However, there are many advantages to expanding the types of TTL logic devices which may be connected to the SCSI computer bus. The inclusion of both open collector and tri-state devices for interconnection by a hot plugging method, as will be described later, was discovered to cause operational problems on the SCSI bus. With the widening use of SCSI buses and SCSI compatible devices an attempt was made to use hot plugging techniques on SCSI compatible devices in a fault tolerant environment. The use of SCSI compatible devices in a hot plugging mode would greatly enhance the availability of these devices for fault tolerant operation. However, it was discovered that while many such devices worked with the usual hot plugging technique, some types of SCSI compatible devices disrupted ongoing transfers on the data bus when they were connected.

Thus the problem of hot plugging permitted devices to a SCSI bus has not been encountered before and the prior art methods and apparatus of providing ground contact prior to connecting power and signal to transmit or receive data can in many instances cause disruption of the two-way data flow on the SCSI bus. While the problems were discovered with respect to the two types of TTL devices permitted by the SCSI specification, the problems also exist for hot plugging of NMOs and CMOS implemented peripheral devices, for example, onto a computer bus. There must be a sufficient delay for all peripheral devices to assume a stable high impedance state before data bus connection can begin.

OBJECTS OF THE INVENTION

It is an object of the invention to provide a method and apparatus for the rapid interconnection of peripheral devices to and a computer data bus without disrupting the transfer of data on an active bus.

It is a further object of the present invention to provide a method and apparatus to enable the hot plugging of any specified peripheral direct access storage device to a standardized Small Computer System Interface (SCSI) bus without disrupting the ongoing transfers of data on an active bus.

SUMMARY OF THE INVENTION

A method of rapid interconnection by means of a multi-conductor connector for connecting peripheral device controller circuits to a computer bus, which bus provides both power and input/output data transfer, without disrupting ongoing data transfers on an active bus is described as comprising in sequence: interconnecting the ground terminals for power and data input/output transfer; interconnecting power to the controller circuit; waiting a period of time for voltage on the controller circuit to stabilize and for the controller circuit to establish a stable high impedance state; and interconnecting the data input/output terminals of the controller circuit to the data bus.

An apparatus for the rapid interconnection by means of a multi-conductor connector for connecting a peripheral device controller circuit to a computer bus, which bus provides both power and input/output data transfer, without disrupting ongoing data transfers on an active bus is described as comprising: means for interconnecting the ground terminals for power and data input/output; means for interconnecting power to the controller circuit subsequent to the interconnection of the grounds; means for delaying for a predetermined time further interconnections until stabilization of voltage on the controller circuit and for the controller circuit to establish a stable high impedance state; and means for interconnecting data input/output terminals of the controller circuit to the data bus after the predetermined time.

DESCRIPTION OF THE PREFERRED EMBODIMENT

Figure 1:
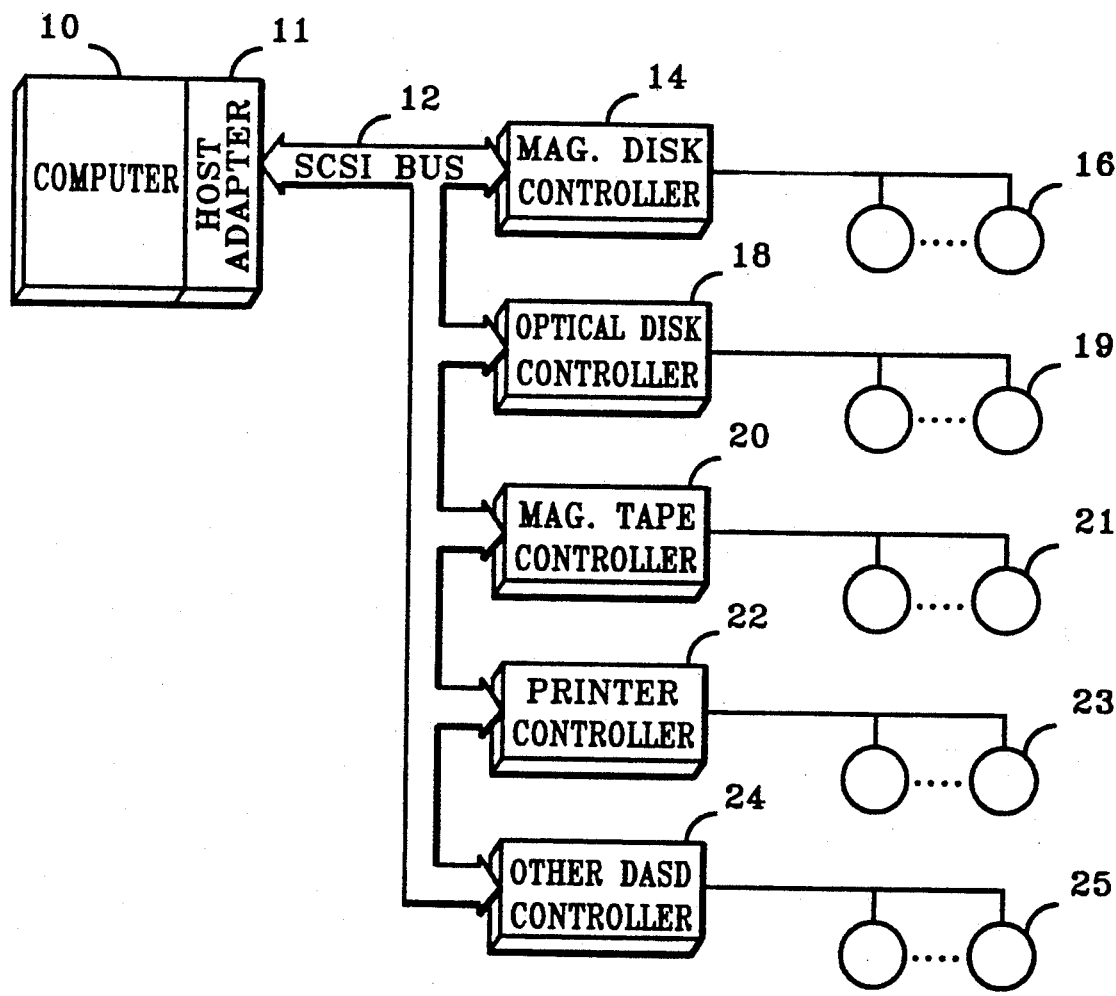
FIG. 1 shows in block diagram form the interconnection of several peripheral devices and controllers to a SCSI bus for a single computer.

FIG. 1 shows in block diagram form the interconnection of several peripheral devices via a SCSI bus to a single computer. In particular, a computer 10 with host adapter 11 is shown to be interconnected with a SCSI bus designated 12. Also, coupled to bus 12 is a magnetic disk controller 14 and a plurality of magnetic disk devices generally designated as 16. In a similar manner, optical disk controller 18 and a plurality of optical disks 19 are shown coupled to the bus along with magnetic tape controller 20 and a plurality of magnetic tape drives 21, printer controller 22 and a plurality of printers 23, and other direct access storage device (DASD) controller 24 along with a plurality of DASD devices 25. Each of the controller devices may have one or more storage devices coupled to them. In general, based upon a requirement of computer 10 during it's normal course of operation under control by an application program, information and requests go on the bus 12 to the SCSI compatible devices via the appropriate controllers to either store or retrieve information from the storage device.

FIG. 1 will be recognized by those skilled in the art as the ordinary interconnection of a generalized computer interface bus with appropriate peripheral storage devices and the environment in which the present invention may be utilized. The problem presented is one of providing a method and apparatus to enable the hot plugging of compatible interface or controller circuits for computer peripheral devices to a generalized computer bus and more specifically to a SCSI bus.

Figure 2:
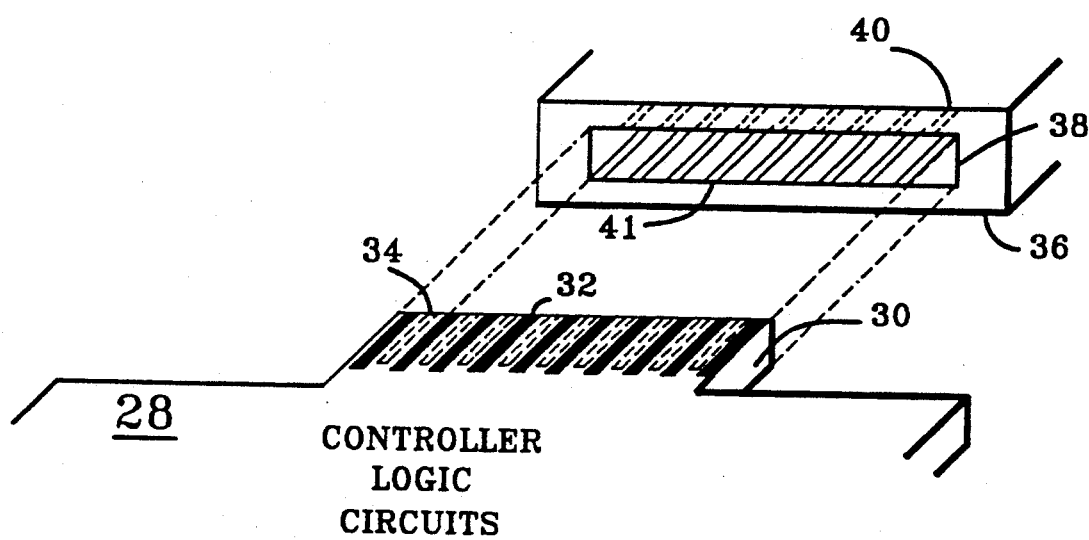
FIG. 2 shows an edge connector mounted on a controller logic circuit PC board and a corresponding mating connector for interconnection with a computer data bus.

FIG. 2 shows a printed circuit board 28 supporting peripheral device controller logic circuits (not shown) having an edge connector portion 30 which comprises a series of parallel electrical conductors 32 and 34 which may be mounted on either or both sides of the printed circuit board. The terms pc board and pc card with be used interchangeably. Adjacent to the edge connector portion 30 of the printed circuit card 28 is a corresponding or mating connector 36 coupling the individual parallel electrical connectors 32 and 34 on the card to the appropriate interconnections 40 and 41 on the computer data bus. FIG. 2 is an example of the interconnection of controller cards for many such computer bus devices and is clearly well known to those skilled in the art. The insertion of the card into the appropriate or mating connector slot 38 which is coupled to a computer bus, e.g. a SCSI bus, causes the electrical interconnection of all of the controller logic circuit conductors on the printed circuit card with the SCSI bus. These normally include power, data and ground connections for the controller circuit. It is thus the preferred way of interconnecting controller cards for peripheral devices to computer buses.

Unlike specially designed computer interface buses which permit the hot plugging of field replaceable units, such as direct access storage devices and their appropriate controller circuits, the SCSI bus permits the use of two types of TTL devices, which have substantially different electrical characteristics. Thus, it has been discovered that in an effort to provide a standardized interface bus, the SCSI bus includes provisions for types of transistor to transistor logic which would ordinarily prevent a hot plugging capability from being implemented with the SCSI bus. In section 4.4. of the SCSI specification, more than one type of TTL logic has been specified for utilization with the SCSI interface bus. In an effort to understand the background for this problem, a review of the two types of transistor to transistor logic types, namely open collector and tri-state devices is included.

In general, there are only two steady state output conditions on a TTL gate. The output low state is within a few tenths of a volt of ground and it is called a "positive logic 0". In this state the output is capable of sinking a considerable current. The output high state is above 2.4 volts and it is called a "positive logic 1". The output high state is well below the standard 5 volt positive supply of voltage. When a TTL gate is provided with an open collector output, it is referred to as open collector logic device. These gates may be connected to other open collector output gates to perform additional logic. Both FIGS. 3A and 3B, and the corresponding attributes and limitations of normal operation are well known to those skilled in the art. The two device types are presented here to show the diversity of TTL logic circuits which may interface with a SCSI bus.

Figure 3A:
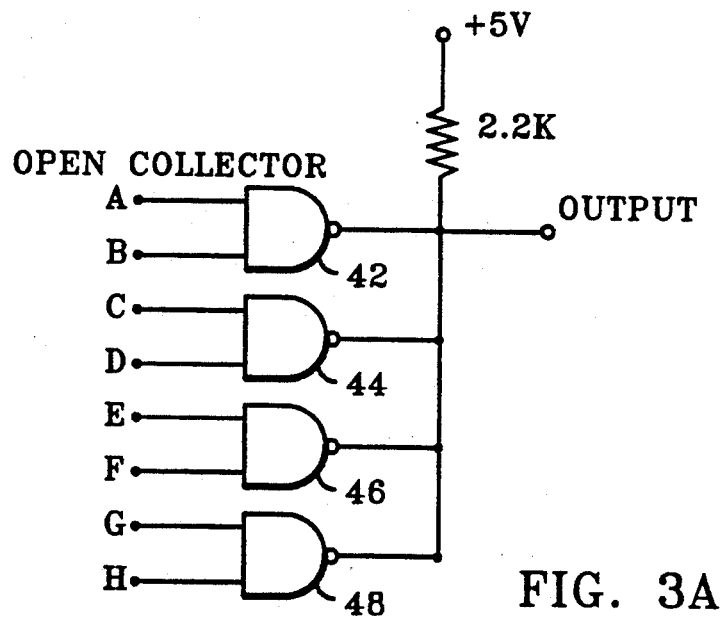
FIGS. 3A and 3B show examples of the electrical schematics for open collector and tri-state TTL type controller circuits for computer peripheral devices.

FIG. 3A shows four NAND gates designated 42, 44, 46 and 48 having common outputs coupled together to a terminal labeled output and through a 2.2K resistor to a source of +5 volt. The TTL gates arranged in the manner shown form an open collector logic circuit. The system speed can suffer as inclusion of a pull-up resistor at the output does slow the output rise time. Such open collector devices tend to show a sensitivity to an input noise problem and because of the pull-up resistor cannot hope to be as fast as a device operating as an individual gate. In addition, with such a logic arrangement there is no easy way to find a faulty part without removing or separating devices since the outputs are tied together.

Figure 3B:
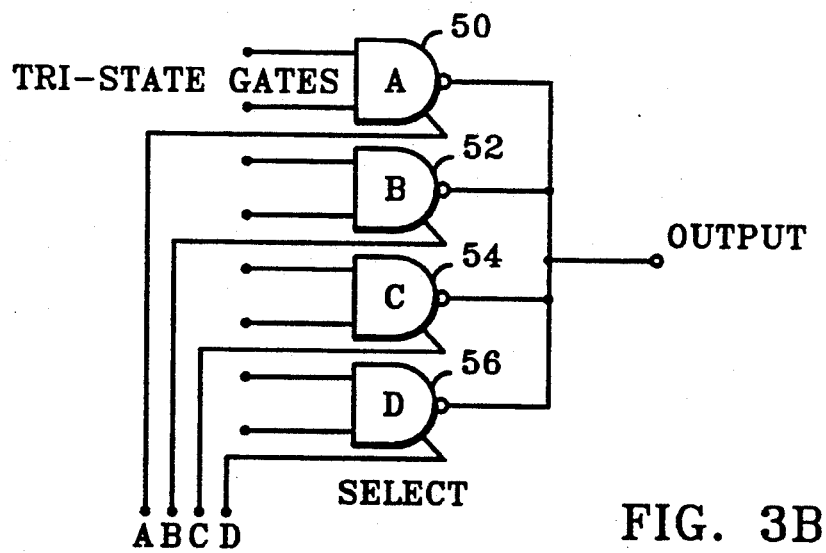

By contrast, FIG. 3B shows four AND gates designated 50, 52, 54, and 56 arranged in the manner shown to form a tri-state device. Each AND gate has two distinct input terminals and their outputs are all coupled together to a common output. In addition, each of the AND gates has a select or enable input terminal coupled to the device. Tri-state or three state logic has been suggested to overcome some of the speed limitations of open collector devices, but at a somewhat higher price. Operationally tri-state devices come up to output levels after power is applied many times faster than do open collector devices. The third state of tri-state logic is an open circuit. Any tri-state device has an output enable control which when activated causes the output to behave as an ordinary TTL gate, with either an active pull-up for logic one or a current sinking pull down for a logic 0. In the third state the internal circuitry is essentially disconnected from the output which is then allowed to assume a high impedance state, thus making the circuit essentially transparent to anything connected to the output.

Each peripheral device controller card is provided with suitable electronic logic circuits to interface the peripheral device with the computer bus and engage in transfers of data and other information. To insure proper voltage at the logic circuits the controller card contains a power regulator which interconnects with the power connections of the computer bus to provide regulated voltage for the logic on the card. The hot plugging of controller cards not only involves the speed with which the TTL logic devices become operational after the application of power, but also the normal voltage rise time for the card mounted regulator to assume a nominal voltage. By contrast, the rise time of the logic is a function of the type of TTL logic employed. In a similar manner, the time required to achieve a stable high impedance state would also be a function of an NMOS or CMOS circuit implementation for the peripheral device.

Hot plugging requires a non-interference with the active or ongoing data transfer that exists on the bus when a device is plugged in or unplugged. The designers of a total data bus system can ensure that a particular bus will meet the design criteria by restricting the device controllers that are allowed on the bus such as by permitting only open collector type TTL devices. This is not possible on the SCSI bus and indeed the SCSI specification allows different manufacturers of SCSI compatible devices to use different logic devices with different characteristic impedances. The hot plugging problem that has been observed is that false signal levels can be impressed on the bus especially during the power-on phase for TTL devices. This is the time when it was discovered that the controller circuit voltage is not fully regulated and the switching levels of the devices are such that output lines may start to oscillate between high and low TTL levels until the voltage is stabilized. If these devices were connected to an active data bus, errors would be injected onto the bus.

Figure 4A:
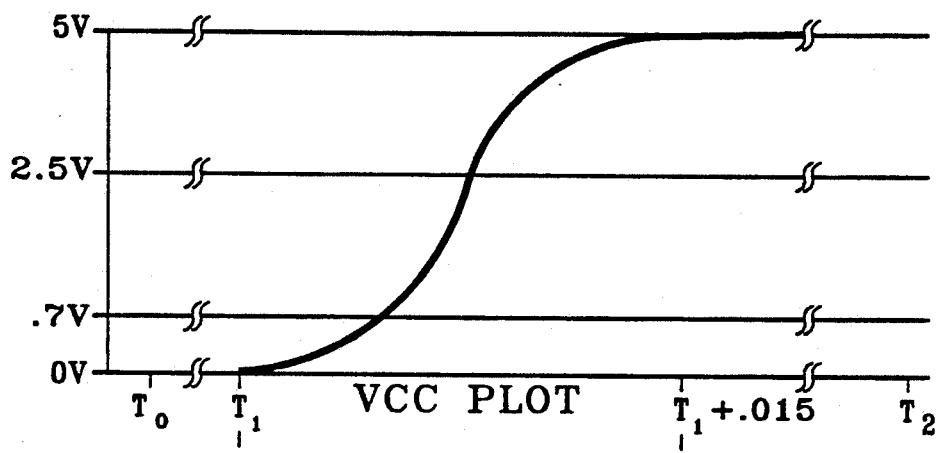
FIGS. 4A and 4B show respectively the voltage versus time traces for the voltage regulator on a typical controller circuit and the voltage trace at the data output terminals of a controller circuit mating with a computer bus.

FIG. 4A shows the voltage versus time traces for a standard voltage regulator normally mounted on the device controller card. At time T0 the ground interconnections are made. Upon power connection to the computer bus the voltage regulator for the controller circuit comes into regulation in a well known manner. When the power is applied to the controller logic circuits at time T1 the voltage for the logic circuits begins to rise from a 0 voltage level. The trace shows four principal ordinate values, 0 volts, 0.7 volts, 2.5 volts, and 5 volts. Voltages at the output terminals of the logic circuits between 0 and 0.7 volts will be determined as a "logic 0" and voltage levels at output terminals between 2.5 and 5 volts will be determined to be a "logic 1". The region between 0.7 volts and 2.5 volts is an undefined band gap region for which voltages will not be treated as either logic 1's or 0's. It is thus a logic indeterminate region. Continuing with the description of the trace, at time T1 when voltage is applied from the bus, the voltage output of the voltage regulator on the controller circuit begins to increase as a function of time. The trace shows the voltage output for the regulator on a control card continues to increase until approximately 0.015 sec. from application of power from the bus, the regulator has achieved its nominal 5 volts output preferably to within 10% of nominal value. This is a function of the electronics of the regulator which is standard and normally provided for either open collector or tri-state devices controller cards. If voltage from the on card regulator were supplied to the logic circuits at time T2 the voltage would be more stabilized preferably to within 1% of its 5 v nominal value and the logic circuits would have achieved a stable high impedance state.

Figure 4B:
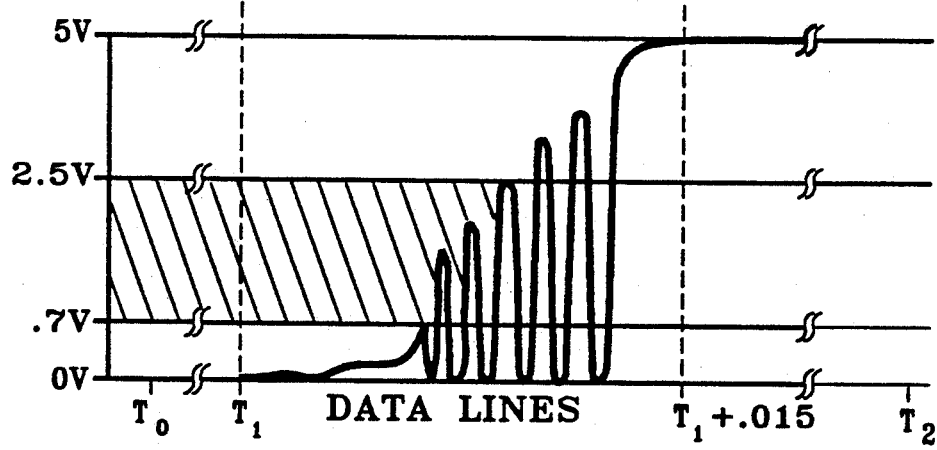

FIG. 4B shows the voltage verses time trace for the output data lines of a tri-state controller logic circuit. The same four principal ordinate values of voltage are shown but now the band gap region from 0.7 v to 2.5 volts is shown cross hatched for emphasis. At T1, when power is applied from the bus, the voltage regulator responds as shown in FIG. 4A and so do the tri-state output data lines as shown in FIG. 4B. During the time interval from T1 to T1+0.015 sec. there is a ringing phenomenon observed especially for the tri-state output devices. This produces short term spurious signals on the bus which are variously in the "logic 0", band gap and "logic 1" ranges. None of these impressed output values is valid and results only from the propagation of transients through the tri-state controller card logic circuits. Thus, during hot plugging, ongoing data transfers on an active bus can be totally disrupted by the hot plug connection of a new tri-state implemented SCSI compatible device. Subsequent to time T1+0.015 sec. when the voltage output lines will have stabilized, in this case the levels are shown to be at logic 1 and there is a very small probability that disruptions would be caused on the bus. If the time to enable the activation of data lines was delayed until T2, the point at which the voltage regulator was within 1% of its nominal value, then there would be no problem with the completion of the hot plugging.

The normal method for hot plugging controller cards in a fault tolerant environment using TTL logic is to utilize the practice of increasing the length of the ground connectors so that when a controller card is plugged in, ground connections are made first and then all other connections to apply power to the regulator and activate the logic circuits. The circuit designer has complete control over the design of the fault tolerant computer bus being implemented and can select or reject logic devices accordingly. But with a standardized bus, such as the SCSI bus, the designer is limited in which types of logic circuits for peripheral devices he can select or reject. Assurance must also be provided so that the design does not interfere with ongoing bus operations during hot plugging.

The first attempt at a solution following normal fault tolerant techniques, was to allow ground interconnections to occur first and to adjust and voltage/power connections so that they occur simultaneously. However, this causes disruption in the power level on the bus because of excessive loading and subsequently causes data errors on the bus. Signal levels on the bus can be lowered to a point that other devices may be completely disengaged from the bus, thus completely disrupting data transfer and further causing start up rise time disruption when they try to come back on line.

The second attempt at a solution was to adjust the data connections so that the ground and data interconnections occur simultaneously. This causes excessive loading and disruption of the data transfer on the bus immediately. Applying power subsequently cannot resolve the problem since the damage has already been done.

The solution has been found to be sequentially connecting the grounds, power and data lines for controller cards exhibiting the delay of 0.015 sec. as indicated in the discussion for FIG. 4B. Thus as shown in FIGS. 4A and 4B, T0: would correspond to the ground interconnection; T1: the application of voltage from the bus; T1+0.015 sec. would correspond to voltage regulation to within 10% of nominal value; T2: would correspond to voltage regulation to within 1% of nominal value; and the interval T2-T1 would preferably be 0.090 sec. or approximately 6 times the 0.015 sec. interval. This is most easily implemented electronically by placing logic transmission gates or other suitable switches at all of the control circuit data line connections and delaying the enabling of those transmission gates until the voltage regulator has reached its steady state value and assumed a high impedance level. A time delay device controlling the switches would have to work properly during the entire power up operation, which could be to either the 10% or 1% nominal values. However, considerable real estate on the controller circuit board would be required to implement this solution. It may also cause difficulty in identifying and isolating the fault source in fault tolerant designs. A considerably simpler solution has been achieved by the careful utilization of the differential length connectors of the type used to implement normal hot plugging of peripheral devices with a fault tolerant bus.

Figure 5:
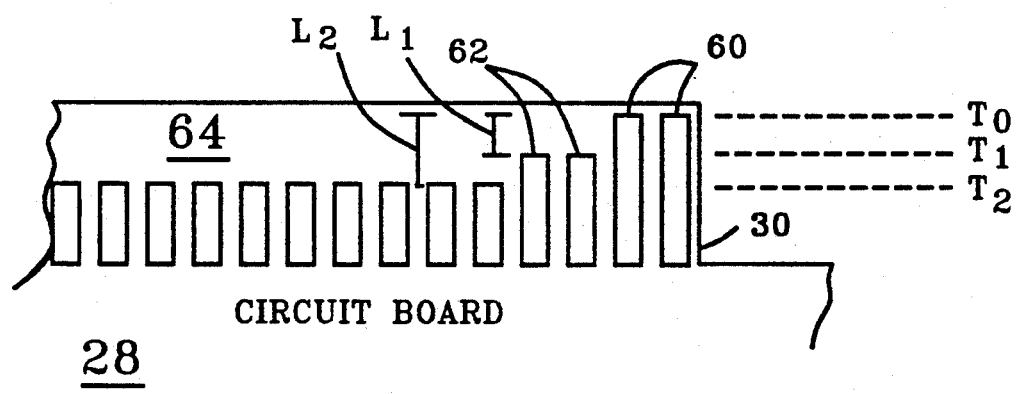
FIG. 5 shows the electrical conductor tab arrangement for an edge connector for a controller circuit employing the present invention and also shows schematically the corresponding interconnection times.

FIG. 5 shows the preferred embodiment for the present invention. It comprises an apparatus which in conjunction with a method for interconnecting SCSI compatible devices to allow for hot plugging in any environment especially a fault tolerant one. The connector portion 30 of a PC controller card is shown with three sets of conductive strips having different lengths. Conductors 60 are utilized for the ground interconnections, and form the base line from which length measurements are made. Conductors 62 are utilized for the power interconnections and are spaced at a distance L1 from the base line of the ground conductors 60 and conductors 64 are utilized for the controller data line interconnections and are positioned at a distance, L2 from the base line of ground conductors 60. The relative lengths are chosen so that for a reasonable insertion force, sufficient time elapses between the interconnection of conductors 62 and the subsequent interconnection of conductors 64, to eliminate all transients and establish a stable high impedance state.

As shown in FIG. 5 the ground conductors 60 interconnect with the bus at time T0; the power conductors 62 at time T1 and the data line conductors at a time greater than T1. As for normal fault tolerant interconnections the time between T1 and T0 is not critical but should be sufficient to assure all ground lines in the logic circuits have reached the computer ground. For the TTL logic system, a minimum of 0.015 sec. has been found to be acceptable for the difference between T1 and T2 but a time difference of 0.090 is preferred. The lengths for conductors 60, 62 and 64 are chosen to establish interconnections at times T0, T1 and T2 respectively. In the preferred embodiment the lengths are L1: 1.78 mm (0.070 in) and L2: 2.54 mm (0.100 in) relative to the ground conductors 60 base line.

Thus, regardless of which of the allowable types of logic circuitry are used for the device interface controller, the conductive contacts are arranged to permit the grounds to be connected first then, power to voltage regulator on the controller card, and after a suitable time for the settling of transients as shown in FIG. 4B, the data input and output connections to the SCSI bus are connected. In this way no transient signals from the electronic circuitry for the controller card will be impressed on the data bus nor can there be an inordinate electrical loading provided to the bus. This provides a simple yet elegant solution to the problem of providing a hot plugging capability of devices which are compatible with a SCSI bus. While the preferred embodiment has shown the implementation for two types of TTL logic it will be clear to those skilled in the art that the invention may be used for other implementations including differences in NMO and CMOS implemented peripheral devices which also exhibit the phenomena of having different times to come up to full voltage, and the possibility of excessive loading on a bus and clear transient signals during power on.

What is claimed is:

1. A data processing system comprising
   a computer having an SCSI bus;
   a plurality of peripheral device controllers coupled to the computer by the bus, each controller including control logic circuits and a voltage regulator for applying voltage to said logic circuits and having no delay, reset or degating circuits interposed between the logic circuits and the bus, said logic circuits selected from a class of devices having differing electrical characteristics but complying with the requirements of a defined specification for said class;
   said bus providing both power to and data transfer with the voltage regulator and logic circuits of each controller; and
   apparatus for the hot plugging of each peripheral device controller to the SCSI computer bus without disrupting data transfers on an active bus and without the use of delay, reset or degating circuits in the controller, comprising:

edge connector means attached to the bus for interconnection of the bus with a corresponding receptacle in a respective controller having parallel arrangement of plural conductors, of three different lengths, for establishing predetermined sequential electrical interconnections with the applications of a reasonable insertion force;

at least one longest length of conductor being coupled to voltage regulator and logic circuit ground terminals of the respective controller for providing a first electrical interconnection;

at least one intermediate length conductor being coupled to a power terminal of the voltage regulator of the respective controller to provide a second electrical interconnection which occurs subsequent to said first interconnection, the relative lengths of the longest length conductor and the intermediate length conductor being chosen so that, with reasonable insertion force, a sufficient time delay is provided between the first and second electrical interconnections to allow for stabilization of voltage transients induced into the bus by the first interconnection; and the shortest length conductors being coupled to the data input/output terminals of the controller circuit to provide a third electrical interconnection which occurs subsequent to said second interconnection, the relative lengths of the intermediate length conductor and the shortest length conductors being chosen such that, with a reasonable insertion force, a sufficient time delay is provided between the second electrical interconnection and the third electrical interconnection to stabilize the voltage output of the controller voltage regulator and establish a high impedance state in the regulator prior to the third electrical connection.

2. The system of claim 1 wherein the difference in length between the longest and intermediate length conductors and the longest and shortest length conductors are in the order of 0.070 and 0.100 inch respectively to provide said time delays between said electrical interconnection upon the application of said reasonable insertion force.

3. Data processing apparatus comprising an active computer bus and a plurality of electrical receptacles each with a first series of parallel ground, voltage and signal conductors electrically connected to the bus;

a plurality of peripheral device controller cards, each having a mating edge connector with a respective second series of ground, voltage and signal parallel conductors for connection with respective ones of the first series of parallel conductors of a respective receptacle;

each card having controller logic circuits with ground and signal terminals coupled to the second ground and signal conductors and comprised of devices selected from a class of devices having differing electrical characteristics but which comply with the requirements of a defined specification for said class, and each card including a voltage regulator with an input coupled to the second ground and voltage conductors and an output coupled to voltage terminals of the logic circuits for regulating the voltage applied to said logic circuits;

said voltage regulator and logic circuits of each card being directly connected to the parallel conductors of said card without the use of intervening delay, reset or degating circuits;

said active bus providing both power to and data transfer with said controller cards;

the ground, voltage and signal conductors of each edge connector having respectively longest, intermediate and shortest lengths for establishing sequential electrical interconnection with the ground, voltage and signal conductors of a receptacle to which the edge connector is connected without disrupting data transfers on the active bus;

the relative lengths of the ground and voltage conductors of an edge connector being chosen such that, with a reasonable insertion force applied to a card to connect it to a receptacle, a sufficient time delay is provided between the ground and voltage interconnections to allow for stabilization of voltage transients induced by the interconnection of the controller circuit ground terminals with a receptacle ground conductor;

the relative lengths of the voltage and signal conductors of an edge connector being chosen such that, with a reasonable insertion force applied to a card to connect it to a receptacle, a sufficient time delay is provided between the voltage and signal interconnections to stabilize the voltage output of the voltage regulator on the card and establish a high impedance state.

4. The apparatus of claim 3 wherein the computer bus is an SCSI bus and wherein the class of devices includes TTL open collector and tri-state devices which comply with the requirements of a defined SCSI specification.

5. The apparatus of claim 4 wherein the class of devices includes NMOS and CMOS devices which comply with the requirements of the defined SCSI specification.

6. A peripheral direct access storage device controller printed circuit card containing electronic logic circuits electrically interconnected to control said device, a voltage regulator for applying regulated voltage to the circuits, and including an apparatus for hot plugging the card into a Small Computer System Interface (SCSI) bus to provide both power and data input/output transfer without the use of delay, reset or degating circuits interposed between the logic circuits and the bus, said logic circuits selected from a class of devices having differing characteristics but complying with the requirements of a defined SCSI specification, said apparatus comprising:

a parallel arrangement of a plurality of edge conductors on said printed circuit card, electrically interconnected to said voltage regulator and electronic logic circuits, said conductors being of three distinct set back lengths from the edge of said printed circuit card for establishing predetermined sequential electrical interconnections of said card to said bus upon the application of a reasonable insertion force to the card to interconnect the card to the bus, a first length one of said conductors coupled to ground terminals of said voltage regulator and logic circuits for providing a first electrical interconnection with said bus, an intermediate length one of said conductors coupled to power terminals of said voltage regulator for providing a second electrical interconnection with said bus upon stabilization of voltage transients induced into the bus by the first interconnection, and third length ones of said conductors coupled to data lines of said logic circuits for providing a third electrical interconnection with said bus upon the stabilization of voltage in the voltage regulator and logic circuits and the establishment of a high impedance state in the voltage regulator subsequent to the second interconnection.

* * * * *